United States Patent
Youn et al.

[11] Patent Number: 6,100,164
[45] Date of Patent: Aug. 8, 2000

[54] METHOD OF FABRICATING SEMICONDUCTOR DEVICE

[75] Inventors: Kang-Sik Youn, Chungcheongbuk-Do; Ki-Seog Youn, Kyeongsangnam-Do; Ku-Chul Joung, Chungcheongbuk-Do, all of Rep. of Korea

[73] Assignee: LG Semicon Co., Ltd., Rep. of Korea

[21] Appl. No.: 08/990,720

[22] Filed: Dec. 15, 1997

[30] Foreign Application Priority Data

Dec. 26, 1996 [KR] Rep. of Korea ............. 96-72492

[51] Int. Cl.⁷ ........................................... H01L 21/76
[52] U.S. Cl. .......................................... 438/444
[58] Field of Search ........................ 438/439, 444, 438/448, 425

[56] References Cited

U.S. PATENT DOCUMENTS

| | | | |
|---|---|---|---|
| 3,961,999 | 6/1976 | Antipov | 438/444 |
| 5,208,181 | 5/1993 | Chi | 438/448 |
| 5,393,692 | 2/1995 | Wu | 438/448 |
| 5,403,770 | 4/1995 | Jang . | |
| 5,834,358 | 11/1998 | Pan et al. | 438/424 |
| 5,891,789 | 4/1999 | Lee | 438/439 |

*Primary Examiner*—Trung Dang

[57] ABSTRACT

A semiconductor device and a method of fabricating the same are disclosed. The method includes the steps of forming an anti-oxidation layer on a substrate, forming an oxidizable layer on portions of the anti-oxidation layer to expose a portion of the anti-oxidation layer, varying a size of the exposed portion of the anti-oxidation layer by oxidizing at least a portion of the oxidizable layer, and forming a trench in the substrate according to the size of the exposed portion of the anti-oxidation layer. The semiconductor device includes an anti-oxidation layer formed on a substrate an oxidation layer formed on portions of the anti-oxidation layer by oxidizing at least a portion of an oxidizable layer, so as to define an isolation region of the semiconductor device, a trench formed in the substrate using the oxidation layer, and a field oxide layer formed in the trench.

17 Claims, 5 Drawing Sheets

METHOD OF FABRICATING SEMICONDUCTOR DEVICE

BACKGROUND OF THE INVENTION

1. Field of the Invention

The present invention relates to a method of fabricating a semiconductor device and, more particularly, to a method of forming an isolation structure of a high-integration device requiring scaling-down.

2. Discussion of Related Art

In order to increase the density of a semiconductor chip having a predetermined size, the scale of isolation regions needs to be reduced. In high-integration devices such as GIGA DRAM requiring the greatest reduction in the size of isolation regions, however, it is difficult to accurately form an isolation structure pattern using a deep ultraviolet (DUV) light generally used in photolithography. A method for overcoming such problems arising from using the DUV light has been proposed and will be discussed below.

FIGS. 1A to 1F are cross-sectional views of a portion of a semiconductor device illustrating a conventional method of fabricating the semiconductor device.

According to the conventional method, as illustrated in FIG. 1A, a pad oxide film 12 and a first nitride film 13 are sequentially deposited on a silicon substrate 11. Subsequently, as illustrated in FIG. 1B, a mask of photoresist pattern 14 is formed on the first nitride film 13. The photoresist layer is exposed to the light having a DUV wave length and developed to form the photoresist pattern 14.

As illustrated in FIG. 1C, the first nitride film 13 is subjected to dry etching to form the first nitride film 13' and to expose a surface of the pad oxide film 12.

As illustrated in FIG. 1D, the photoresist pattern 14 is completely removed. Thereafter, a second nitride film 15 is deposited on the entire surface of the first nitride film 13' and the exposed surface of the pad oxide film 12 by using chemical vapor deposition (CVD). As illustrated in FIG. 1E, the second nitride film 15 is selectively etched to form sidewall spacers 15'. As illustrated in FIG. 1F, the exposed portion of the pad oxide film 12 is removed to expose a predetermined portion of the silicon substrate 11. A field oxide film 16 is formed on the exposed portion of the silicon substrate 11. Then the sidewall spacers 15', the first nitride film 13' and the pad oxide film 12 are completely removed, thereby forming an isolation structure on the silicon substrate 11.

As described above, the conventional method of forming an isolation structure utilizes the sidewall spacers 15', instead of the DUV light, to define a fine pattern for forming an isolation region. However, such a method has problems because it is difficult to pattern a CVD nitride film to form uniform sidewall spacers within a wafer. Therefore, the conventional method complicates the manufacturing process and has a problem of reduced yield.

SUMMARY OF THE INVENTION

Accordingly, the present invention is directed to a method of fabricating a semiconductor device which substantially obviates one or more of the problems due to limitations and disadvantages of the related art.

An object of the present invention is to provide a method of fabricating a semiconductor device wherein an oxidation process is variably performed to control the formation of isolation regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the method of fabricating a semiconductor device according to the embodiments of the present invention includes the steps of forming an anti-oxidation layer on a semiconductor substrate, forming an oxidizable layer on the anti-oxidation layer, exposing a part of the anti-oxidation layer by selectively removing a part of the oxidizable layer, varying the size of the exposed part of the anti-oxidation layer by oxidizing at least a portion of the oxidizable layer, forming a trench in the exposed portion of the substrate and forming a field oxide film in the trench to define an active region of the device. The oxidizable layer is formed by depositing a polysilicon.

It is to be understood that both the foregoing general description and the following detailed description are exemplary and explanatory and are intended to provide further explanation of the invention as claimed.

Briefly described, the present invention is directed to a method of fabricating a semiconductor device, including the steps of forming an anti-oxidation layer on a substrate; forming an oxidizable layer on portions of the anti-oxidation layer; and defining an isolation region by oxidizing at least a portion of the oxidizable layer.

Furthermore, the present invention is directed to a method of fabricating a semiconductor device, including the steps of forming an anti-oxidation layer on a semiconductor substrate; forming an oxidizable layer on portions of the anti-oxidation layer to expose a portion of the anti-oxidation layer; varying a size of the exposed portion of the anti-oxidation layer by oxidizing at least a portion of the oxidizable layer; and forming a trench in the semiconductor substrate according to the size of the exposed portion of the anti-oxidation layer.

Moreover, the present invention is directed to a semiconductor device including an anti-oxidation layer formed on a semiconductor substrate; an oxidation layer formed on portions of the anti-oxidation layer by oxidizing at least a portion of an oxidizable layer, so as to define an isolation region of the semiconductor device; a trench formed in the semiconductor substrate by using the oxidation layer; and a field oxide layer formed in the trench.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein:

FIGS. 1A to 1F are cross-sectional views of a portion of a semiconductor illustrating a conventional method of fabricating the semiconductor device; and FIGS. 2A to 2H are cross-sectional views of a portion of a semiconductor device illustrating a method of fabricating the semiconductor device according to the preferred embodiments of the present invention.

DETAILED DESCRIPTION OF PREFERRED EMBODIMENTS

Reference will now be made in detail to the preferred embodiments of the present invention, examples of which are illustrated in the accompanying drawings.

FIGS. 2A to 2H are cross-sectional views of a portion of a semiconductor device for explaining a method of fabricating the semiconductor device according to the preferred embodiments of the present invention.

Figure 1A:
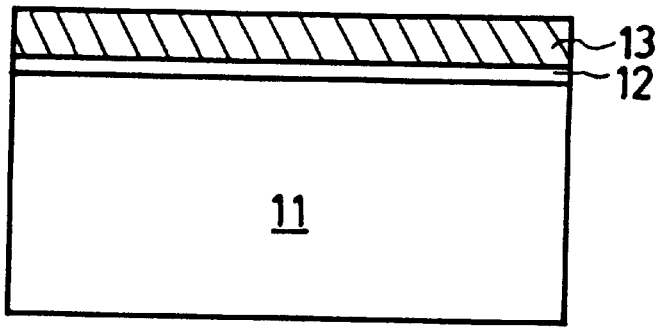
Figure 1B:
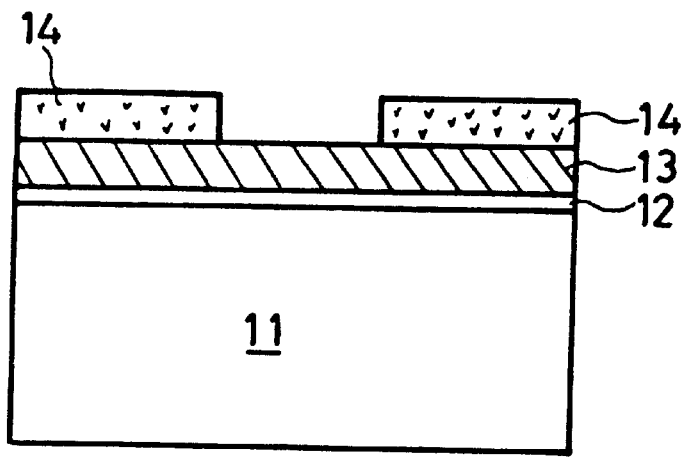
Figure 1C:
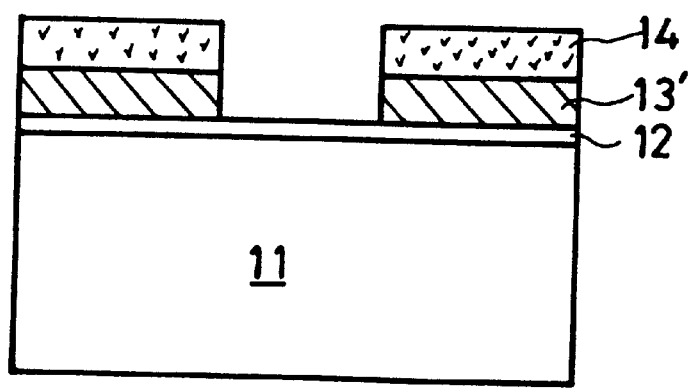
Figure 1D:
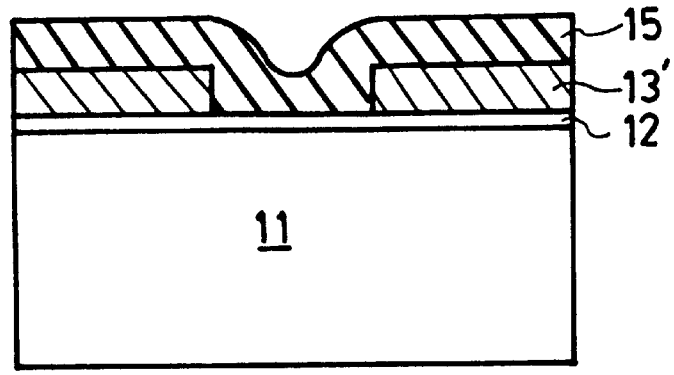
Figure 1E:
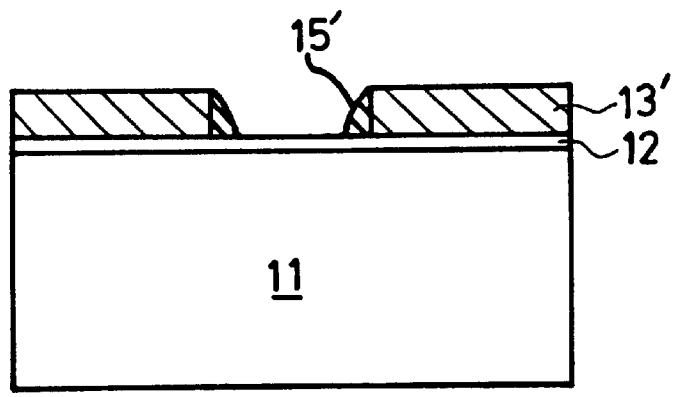
Figure 1F:
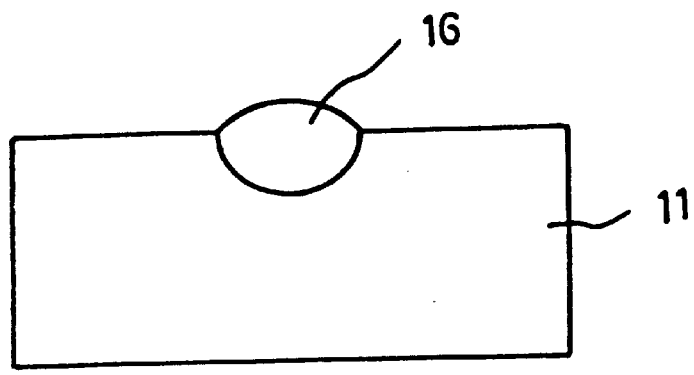
Figure 2A:
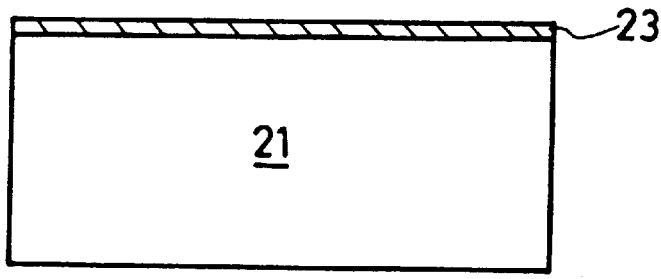

As illustrated in FIG. 2A, an anti-oxidation layer 23 is formed on a silicon substrate 21 by depositing a silicon nitride film on the silicon substrate 21. The silicon nitride film may be formed on the silicon substrate 21 while a pad oxide film (not shown) is formed between the silicon nitride film and the silicon substrate 21 through an oxidation process.

Figure 2B:
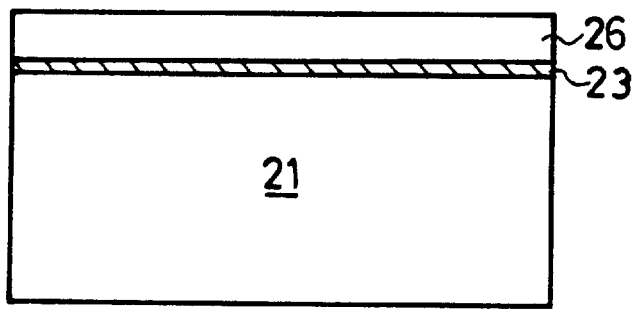

As illustrated in FIG. 2B, an oxidizable layer 26 is formed on the anti-oxidation layer 23. A CVD polysilicon, inflatable during oxidation, is used as the oxidizable layer 26. Germanium or the like can also be used as the oxidizable layer 26.

Figure 2C:
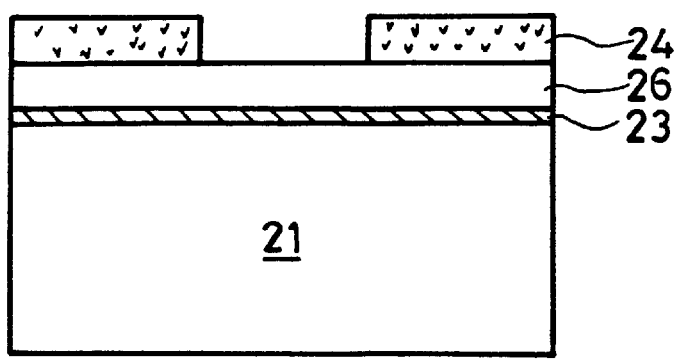

As illustrated in FIG. 2C, a photoresist mask 24 is formed on the oxidizable layer 26 to define an isolation region. To form the mask 24, a photoresist is coated on the oxidizable layer 26 and the photoresist is exposed to DUV light and developed into the photoresist mask 24.

Figure 2D:
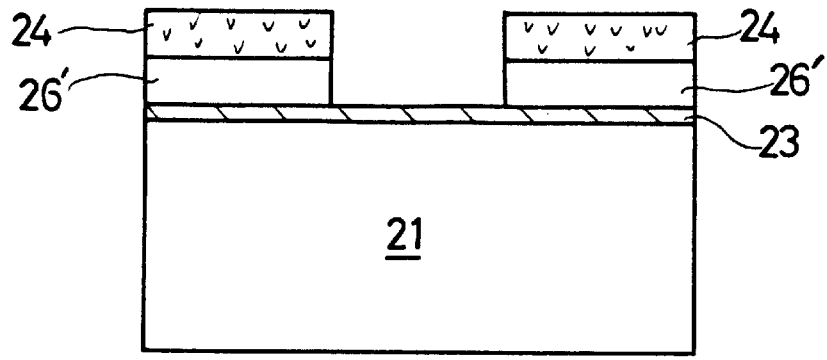

As illustrated in FIG. 2D, using the photoresist mask 24 as a mask the oxidizable layer 26 is selectively etched to form the oxidizable layer 26'. Here, the oxidizable layer 26 is advantageously removed by anisotropic etching using a plasma etching gas to form the oxidizable layer 26'. That is, the oxidizable layer 26 is patterned to expose a portion of the anti-oxidation layer 23. Then the photoresist mask 24 is completely removed using a general method of removing a photoresist.

Figure 2E:
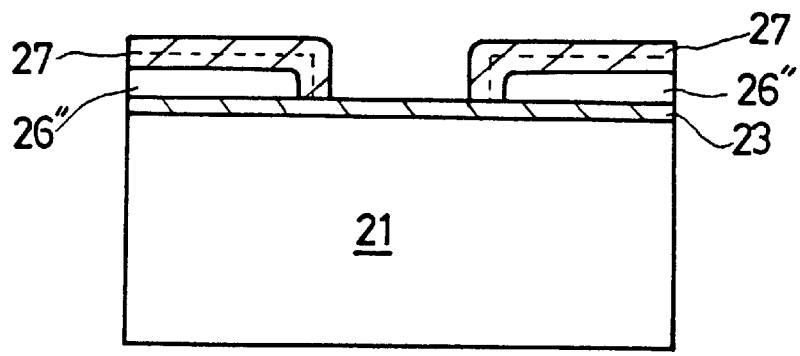

As illustrated in FIG. 2E, the size of the exposed portion of the anti-oxidation layer 23 is reduced or varied as the oxidizable layer 26' is inflated through oxidation. The inflated layer includes an oxidation layer 27 (e.g. silicon oxide film ($SiO_2$)) and a residual oxidizable layer 26". The residual oxidizable layer 26" indicates that the oxidizable layer 26 here is partially oxidized. However, it is possible that the entire oxidizable layer 26 is oxidized. During the oxidation, when a polysilicon is applied to the oxidizable layer 26', the oxidation layer 27 is formed on the surface of the polysilicon through oxidation. The residual oxidizable layer 26" is formed after the oxidation. The dotted line indicates the original oxidizable layer 26' before the oxidation. The oxidation process is used to control the formation of the isolation region, e.g., its size, shape, location, etc. To do so, the oxidation process is performed until the exposed portion of the anti-oxidation layer 23 reaches a desired scale for the isolation region. This is easily and accurately performed by controlling the thickness of the oxide film formed through the oxidation process.

Figure 2F:
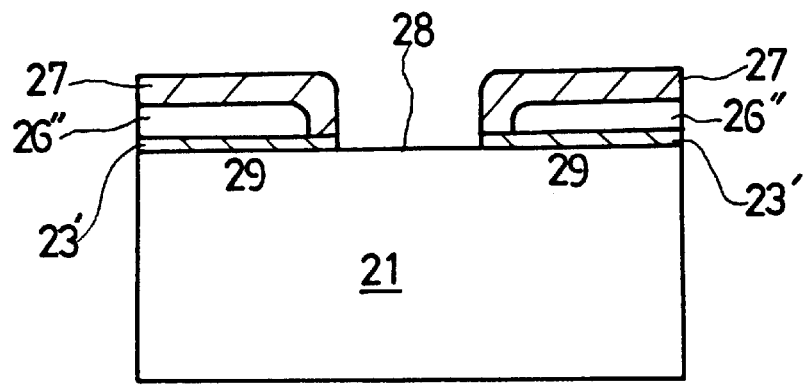

As illustrated in FIG. 2F, the exposed portion of the anti-oxidation layer 23 is selectively etched by using the oxidation layer 27 as a mask to form an anti-oxidation layer pattern 23'. This exposes a first portion 28 of the semiconductor substrate 21, and determines a second portion 29 of the semiconductor substrate 21 as an active region of the device.

Figure 2G:
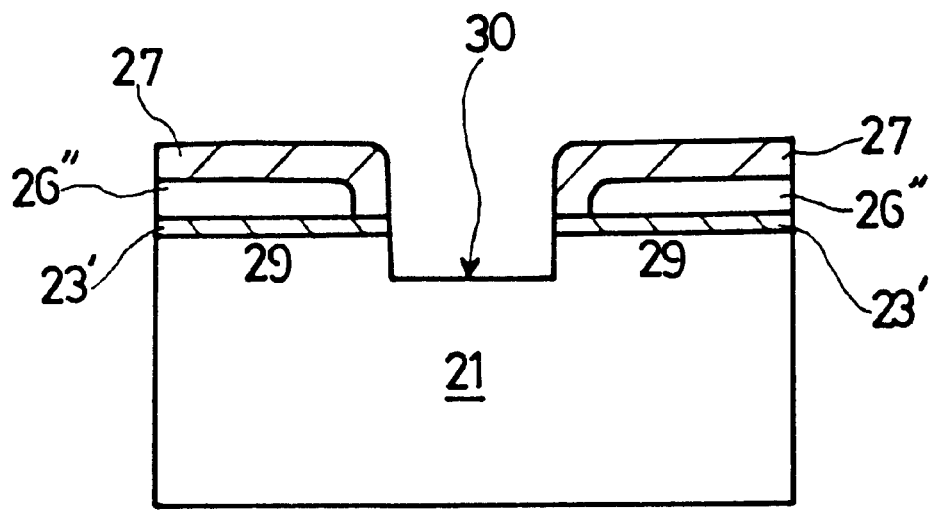

As illustrated in FIG. 2G, a trench 30 is formed by etching the first portion 28 of the semiconductor substrate 21 using anisotropic etching with a plasma-etching gas. The oxidation layer 27 is used as a mask.

Figure 2H:
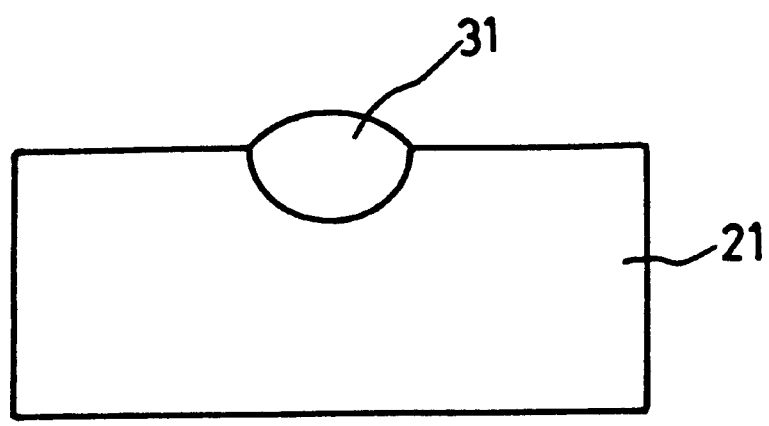

As illustrated in FIG. 2H, a field oxide film 31 is formed by performing a thermal oxidation on a surface of the trench 30. Thereafter, the oxidation layer 27, the residual oxidizable layer 26" and the anti-oxidation layer pattern 23' are completely removed.

In another embodiment of the present invention, a field oxidation layer of LOCOS may be formed on the first portion 28 of the semiconductor substrate 21. When the field oxidation layer is formed thereon, a lamination film having a pad oxidation layer and a silicon nitride film is applied to the anti-oxidation layer 23. As a mask for forming the trench 30 or the field oxide film 31, the nitride film used to form the anti-oxidation layer 23 can be used after removing the oxidation layer 27, or both the oxidation layer 27 and the residual oxidizable layer 26".

Thereafter, the usual process of fabricating the semiconductor device is performed to complete the formation of the semiconductor device.

According to the embodiments of the present invention described above, the method of fabricating the semiconductor device allows accurate control over the formation of isolation regions. This is achieved by varying the thickness of the oxide film (oxidation layer) formed through an oxidation process. In the present method, the size, shape and location of the isolation regions are more easily controlled than in the conventional method which utilizes side wall spacers. As a result, scale-uniformity among the isolation regions of the wafer and the production yield of the device are greatly enhanced.

It will be apparent to those skilled in the art that various modifications and variations can be made in the semiconductor device fabricating method of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:

forming an anti-oxidation layer on a substrate;

forming an oxidizable layer on portions of the anti-oxidation layer;

defining an isolation region by oxidizing at least a portion of the oxidizable layer;

said defining step including, forming an oxidation layer on the anti-oxidation layer; and forming a trench in the substrate using the oxidation layer as a mask.

2. The method as claimed in claim 1, wherein the step of forming the oxidizable layer includes the steps of:

depositing an oxidizable material on the anti-oxidation layer, and patterning the deposited oxidizable material to form the oxidizable layer.

3. The method as claimed in claim 2, wherein the patterning step includes the step of:

selectively removing the oxidizable material by anisotropic etching.

4. The method as claimed in claim 1, wherein the oxidizable layer includes one of polysilicon and germanium.

5. The method as claimed in claim 1, wherein the step of defining the isolation region further includes the step of:

forming an oxidizable layer remainder between the oxidation layer and the anti-oxidation layer.

6. The method as claimed in claim 1, wherein in said isolation region defining step, a size of the isolation region is determined by controlling a thickness of the oxidation layer.

7. The method as claimed in claim 1, further comprising the steps of:
forming a field oxide layer in the trench by a thermal oxidation process, and
removing the oxidation layer and the anti-oxidation layer.

8. The method as claimed in claim 1, further comprising the step:
forming a field oxide layer by performing a thermal oxidation process on a portion of the substrate.

9. The method as claimed in claim 1, wherein the step of forming the anti-oxidation layer includes the steps of:
depositing a silicon nitride film on the substrate, and
patterning the silicon nitride film.

10. The method as claimed in claim 1, wherein the step of forming the anti-oxidation layer includes the step of:
sequentially forming a pad oxide film and a silicon nitride film on the substrate.

11. A method of fabricating a semiconductor device, comprising the steps of:
forming an anti-oxidation layer on a substrate;
forming an oxidizable layer on portions of the anti-oxidation layer to expose a portion of the anti-oxidation layer;
varying a size of the exposed portion of the anti-oxidation layer by oxidizing at least a portion of the oxidizable layer; and
forming a trench in the substrate according to the size of the exposed portion of the anti-oxidation layer.

12. The method as claimed in claim 11, wherein the step of forming the oxidizable layer includes the steps of:
deposing an oxidizable material on the anti-oxidation layer, and
removing a portion of the deposited oxidizable material using anisotropic etching to form the oxidizable layer.

13. The method as claimed in claim 11, wherein the oxidizable layer includes one of polysilicon and germanium.

14. The method as claimed in claim 11, wherein the step of forming the trench includes the steps of:
removing the exposed portion of the anti-oxidation layer to expose a portion of the substrate, and
removing the exposed portion of the substrate to form the trench.

15. The method as claimed in claim 11, wherein the varying step includes the step of:
forming a silicon oxide film ($SiO_2$) and a residual oxidizable layer on the anti-oxidation layer.

16. The method as claimed in claim 11, further comprising the step of:
forming a field oxide layer by performing a thermal oxidation process on a portion of the trench.

17. A method of fabricating a semiconductor device, comprising the steps of:
forming an anti-oxidation layer on a substrate;
forming an oxidizable layer on portions of the anti-oxidation layer;
defining an isolation region by oxidizing at least a portion of the oxidizable layer;
said defining step including,
forming an oxidation layer on the anti-oxidation layer; and
removing a portion of the anti-oxidation layer using the oxidation layer as a mask.

* * * * *